(12) United States Patent
Chen et al.

(10) Patent No.: US 12,207,381 B2
(45) Date of Patent: *Jan. 21, 2025

(54) EXTREME ULTRAVIOLET LITHOGRAPHY SYSTEM WITH HEATED TIN VANE BUCKET HAVING A HEATED COVER

(71) Applicant: TAIWAN SEMICONDUCTOR MANUFACTURING CO., LTD., Hsinchu (TW)

(72) Inventors: Ssu-Yu Chen, New Taipei (TW); Shang-Chieh Chien, New Taipei (TW); Li-Jui Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 185 days.

This patent is subject to a terminal disclaimer.

(21) Appl. No.: 17/712,373

(22) Filed: Apr. 4, 2022

(65) Prior Publication Data

US 2022/0225490 A1    Jul. 14, 2022

Related U.S. Application Data

(63) Continuation of application No. 16/787,947, filed on Feb. 11, 2020, now Pat. No. 11,297,710.

(51) Int. Cl.
*H05G 2/00*     (2006.01)
*G03F 7/00*     (2006.01)

(52) U.S. Cl.
CPC ......... *H05G 2/005* (2013.01); *G03F 7/70033* (2013.01); *G03F 7/70916* (2013.01); *H05G 2/008* (2013.01)

(58) Field of Classification Search
CPC ............ G03F 7/70033; G03F 7/70916; G03F 7/2004; H05G 2/005; H05G 2/008; H05G 2/003

See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |

(Continued)

*Primary Examiner* — Deoram Persaud
(74) *Attorney, Agent, or Firm* — Maschoff Brennan

(57) ABSTRACT

An extreme ultraviolet (EUV) light source and a method for patterning a resist layer on a substrate using the EUV light source are disclosed. For example, the EUV light source includes a droplet generator, a droplet catcher, a laser source, a plurality of vanes, and a bucket. The droplet generator is to generate tin droplets. The droplet catcher is opposite to the droplet generator to catch the tin droplets. The laser source is to generate a laser beam striking the tin droplets to form a plasma. The plurality of vanes are arranged around an axis to collect tin debris created from the plasma. The bucket is connected to the vanes and includes a cover, a vane bucket, and a heater. The cover has an opening. The vane bucket is surrounded by the cover. The heater is on a sidewall of the cover and spaced apart from the droplet catcher.

20 Claims, 7 Drawing Sheets

(56) References Cited

U.S. PATENT DOCUMENTS

| | | | |
|---|---|---|---|
| 9,529,268 B2 | 12/2016 | Chang et al. | |
| 9,548,303 B2 | 1/2017 | Lee et al. | |
| 10,512,147 B1* | 12/2019 | Yang | G03F 7/70033 |
| 10,527,926 B1* | 1/2020 | Yang | G03F 1/22 |
| 10,582,600 B2* | 3/2020 | Kamikanna | H05G 2/003 |
| 2009/0230326 A1* | 9/2009 | Vaschenko | H05G 2/008 |
| | | | 250/492.2 |
| 2012/0248343 A1* | 10/2012 | Nagai | G03F 7/70033 |
| | | | 250/504 R |
| 2019/0104604 A1* | 4/2019 | Chien | H05G 2/006 |
| 2019/0150264 A1 | 5/2019 | Kamikanna | |
| 2019/0155179 A1* | 5/2019 | Wu | H05G 2/008 |
| 2019/0339620 A1* | 11/2019 | Nagano | H05G 2/006 |
| 2021/0033983 A1* | 2/2021 | Chen | G03F 7/70883 |
| 2021/0033986 A1* | 2/2021 | Tu | G03F 7/70033 |
| 2022/0359097 A1* | 11/2022 | Tu | G03F 7/70033 |
| 2023/0132074 A1* | 4/2023 | Yen | H05G 2/005 |
| | | | 250/504 R |

* cited by examiner

EXTREME ULTRAVIOLET LITHOGRAPHY SYSTEM WITH HEATED TIN VANE BUCKET HAVING A HEATED COVER

PRIORITY CLAIM AND CROSS-REFERENCE

This application is a continuation application of U.S. patent application Ser. No. 16/787,947, filed Feb. 11, 2020, now U.S. Pat. No. 11,297,710, issued on Apr. 5, 2022, which is herein incorporated by reference.

BACKGROUND

The semiconductor integrated circuit (IC) industry has experienced exponential growth. Advances in IC materials and design have produced faster and smaller circuits. The circuits have become more complex with more interconnected devices within a smaller area of the IC.

As the circuit density of the IC has increased and the size of the ICs have shrunk over the years, these smaller ICs may use higher resolution lithography processes. One example of a high resolution lithography technique uses extreme ultraviolet lithography (EUVL). The EUVL employs scanners using light in the extreme ultraviolet (EUV) region, having a wavelength of about 1 nanometer (nm) to about 100 nm. EUV scanners may provide projection printing that use reflective optics (e.g., mirrors).

One type of EUV light source is laser-produced plasma (LPP). LPP technology produces EUV light by focusing a high-power laser beam onto small fuel droplet targets to form highly ionized plasma that emits EUV light with a peak of maximum emission at 13.5 nm. The EUV light is then collected by a collector and reflected by optics towards a lithography exposure object (e.g., a wafer or photoresist on a wafer).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
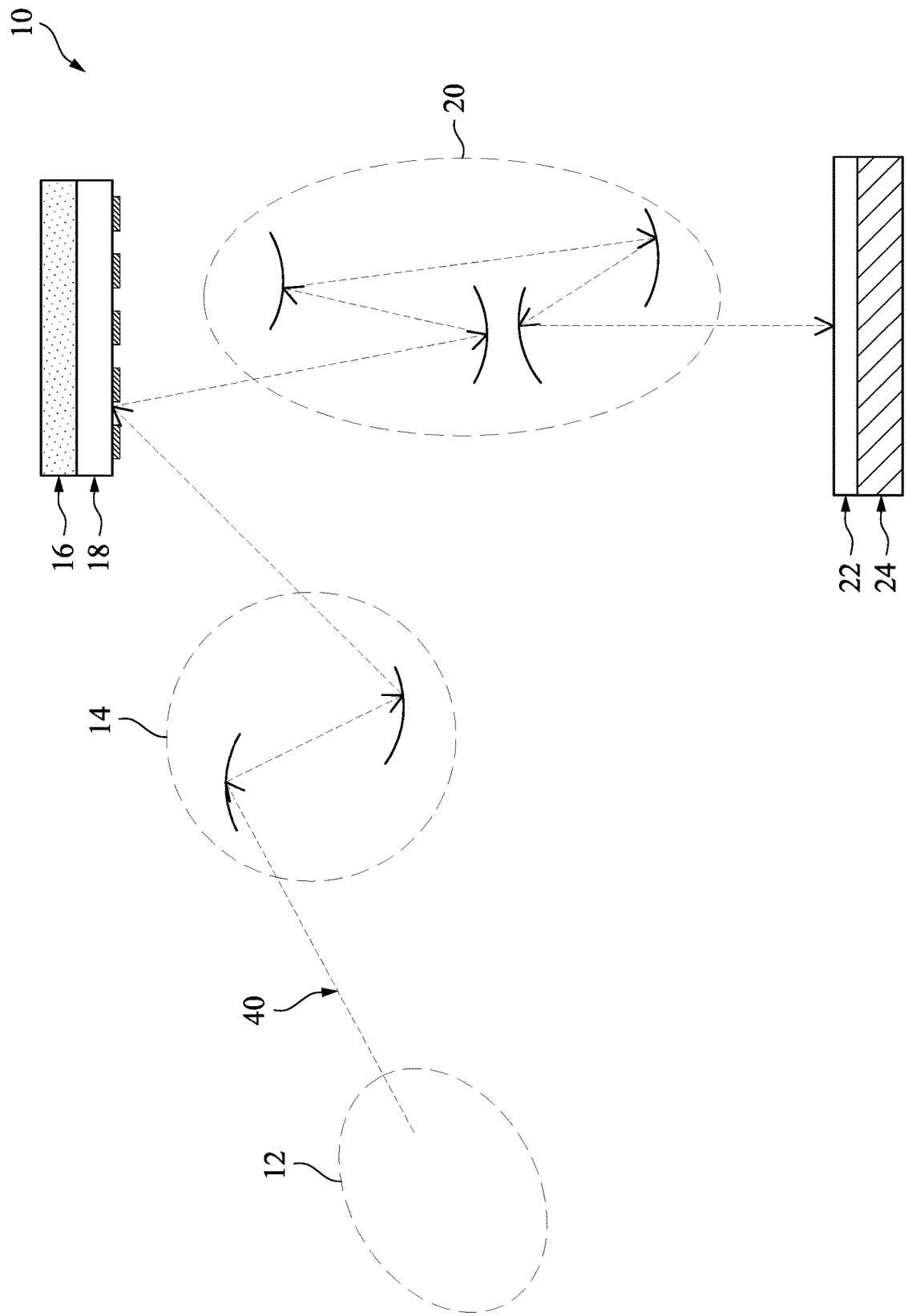
FIG. 1 illustrates a schematic view of an EUV lithography system, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to various embodiments of an EUV lithography system with a heated tin vane bucket having a heated cover. The heated tin vane bucket may be part of an EUV light source or radiation source of the EUV lithography system that is used to collect tin debris that remains after tin droplets are struck by a laser to produce a plasma. The tin debris may be in liquid form, but solidify as it comes into contact with cooler parts of a housing or shell of an extreme ultraviolet (EUV) light source.

For example, due to the wettability of tin droplets, the tin droplets may take a concave shape when falling along a drip pin towards the heated tin vane bucket and cover. However, the surface tension of the tin droplet may pull the tin droplets and cause the tin droplets to fall at an angle rather than straight down through an opening of the cover and into the heated tin vane bucket.

When the tin droplets fall at an angle, the tin droplets may land on a surface of the cover around the opening of the cover. The cooler temperature of the surface may cause the tin droplets to solidify. Over time, many tin droplets may fall and form a stalagmite of tin. The stalagmite of tin may continue to grow upwards towards the drip pin. Eventually, the stalagmite of tin may form inside of the drip pin and clog the drip pin. When the drip pin is clogged, the tin may begin to overflow out of the gutter and towards a collector of the EUV light source.

Hydrogen gas can be provided into the EUV light source to reduce contamination in a laser or radiation source. For example, the hydrogen gas can be heated to convert the hydrogen gas into free radicals that can remove contamination from the laser source.

However, when tin droplets overflow from the gutter towards the collector, the hydrogen radicals may enter the tin droplets. The hydrogen radicals may form a bubble inside of the tin droplets from the high temperatures near the collector when the plasma is formed. The bubbles may eventually burst causing tin spitting onto a heat shield located near the collector. The tin near the heat shield may spill over into the collector causing contamination of the collector.

The collector may be a reflective component (e.g., a mirror) that reflects the EUV radiation generated by the tin plasma to be redirected towards a scanner. However, when tin or other debris, contaminates the collector, the EUV radiation may not be reflected correctly causing the EUV light source to malfunction or operate inefficiently.

Thus, the cover of the heated tin vane bucket of the present disclosure may include a heater. The heater may heat the cover to a melting point temperature of the tin. Thus, the stalagmite of tin may be melted such that it falls through the opening of the cover into the heated tin vane bucket. As a result, the heated cover may prevent the drip pin from being clogged from the tin stalagmites that can form from the surface of the cover towards the drip pin. In addition, eliminating the stalagmites may prevent tin spitting on the heat shield, which could potentially contaminate the collector.

FIG. 1 illustrates a schematic view of a lithography system 10, constructed in accordance with some embodiments. The lithography system 10 may also be generically referred to as a scanner that is operable to perform lithography exposure processes. In the present embodiment, the lithography system 10 is an extreme ultraviolet (EUV) lithography system designed to expose a resist layer by EUV light (or EUV radiation). The resist layer is a material sensitive to the EUV light. The EUV lithography system 10 employs a radiation source 12 to generate EUV light 40, such as EUV light having a wavelength ranging between about 1 nm and about 100 nm. In one particular example, the EUV light 40 has a wavelength centered at about 13.5 nm. Accordingly, the radiation source 12 is also referred to as EUV radiation source 12. The EUV radiation source 12 may utilize a mechanism of laser-produced plasma (LPP) to generate the EUV radiation, which will be further described later.

The lithography system 10 also employs an illuminator 14. In some embodiments, the illuminator 14 includes various reflective optics such as a single mirror or a mirror system having multiple mirrors in order to direct the light 40 from the radiation source 12 onto a mask stage 16, particularly to a mask 18 secured on the mask stage 16.

The lithography system 10 also includes the mask stage 16 configured to secure the mask 18. In some embodiments, the mask stage 16 includes an electrostatic chuck (e-chuck) to secure the mask 18. In the present disclosure, the terms mask, photomask, and reticle are used interchangeably. In the present embodiment, the lithography system 10 is a EUV lithography system, and the mask 18 is a reflective mask. One exemplary structure of the mask 18 includes a substrate with a low thermal expansion material (LTEM). For example, the LTEM may include $TiO_2$ doped $SiO_2$ or other suitable materials with low thermal expansion. The mask 18 includes a reflective multi-layer (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light 40. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). The mask 18 may have other structures or configurations in various embodiments.

The lithography system 10 also includes a projection optics module (or projection optics box (POB)) 20 for imaging the pattern of the mask 18 onto a semiconductor substrate 22 secured on a substrate stage (or wafer stage) 24 of the lithography system 10. The POB 20 includes reflective optics in the present embodiment. The light 40 directed from the mask 18, carrying the image of the pattern defined on the mask 18, is collected by the POB 20. The illuminator 14 and the POB 20 may be collectively referred to as an optical module of the lithography system 10.

In the present embodiment, the semiconductor substrate 22 is a semiconductor wafer, such as a silicon wafer or other type of wafer to be patterned. The semiconductor substrate 22 is coated with a resist layer sensitive to the EUV light 40 in the present embodiment. Various components including those described above are integrated together and are operable to perform lithography exposing processes.

Figure 2:
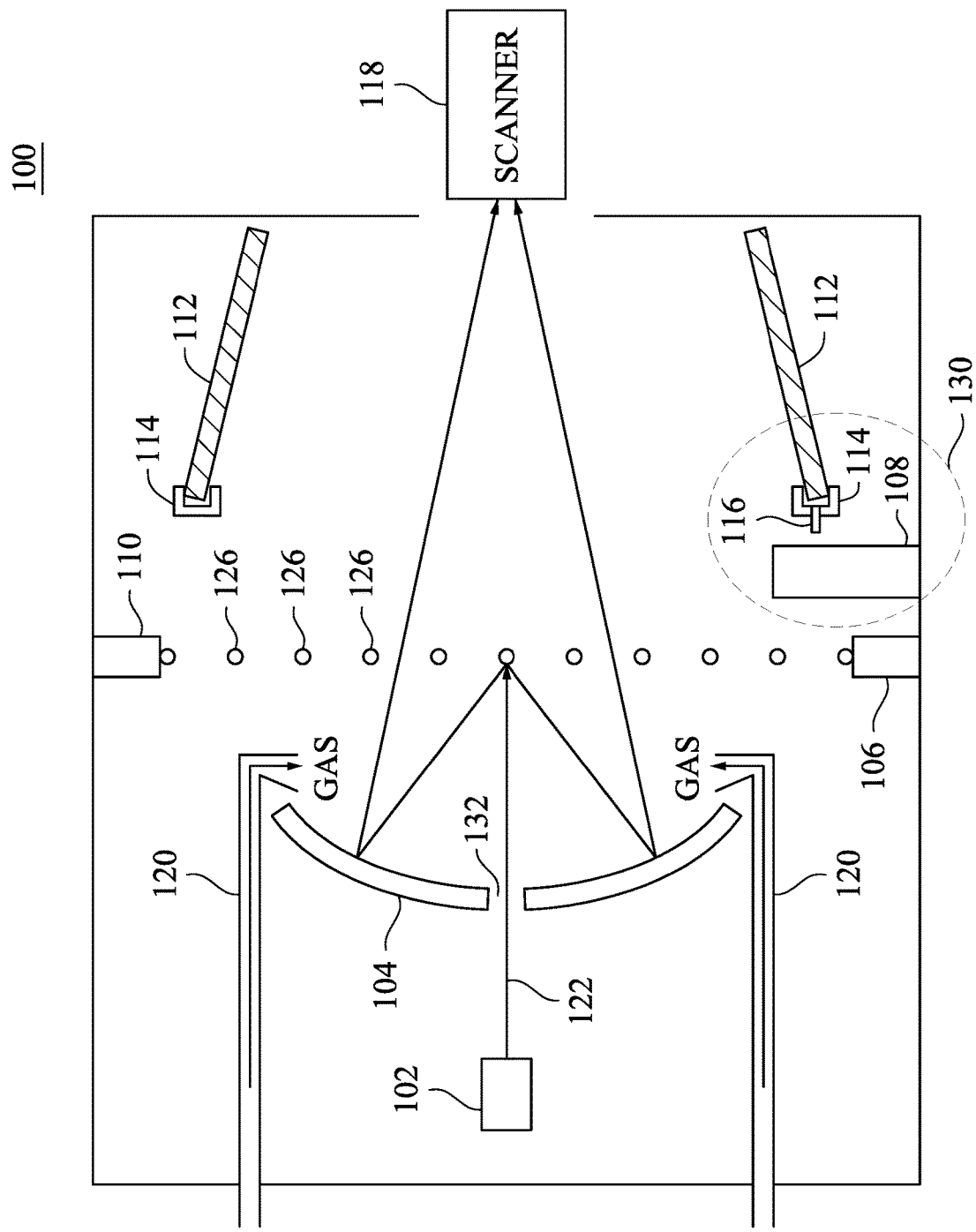
FIG. 2 illustrates a cross-sectional view of an extreme ultra-violet (EUV) light source according to at least one embodiment of the present disclosure.

In one embodiment, the radiation source 12 (also referred to hereinafter as an EUV light source) may include a heated tin vane bucket that is used to collect tin debris, as noted above. However, the tin debris may solidify and form stalagmites that continue to grow upwards towards the drip pin creating a clog in the drip pin. This may cause tin to overflow out of the gutter and towards a collector of the EUV light source. The present disclosure provides a heated cover for the heated tin vane bucket of the EUV light source to prevent the tin from solidifying and clogging the drip pin. FIG. 2 illustrates an example of the EUV light source having a heated tin vane bucket with a heated cover of the present disclosure.

FIG. 2 illustrates an example of an EUV light source 100. The EUV light source 100 may be device that is operable to perform lithography exposure processes. For example, the EUV light source 100 may be part of an EUV lithography system to expose a resist layer (that is sensitive to the EUV light) by EUV light. In one embodiment, the EUV light source 100 may be enclosed in a vessel that is maintained in a vacuum environment (not shown).

In one embodiment, the EUV light source 100 may generate EUV light via laser produced plasma (LPP). For example, the EUV light source 100 may include a laser source 102. The laser source 102 may include a single light source or multiple light sources that can generate at least one laser beam 122. In one embodiment, the laser source 102 may be a carbon dioxide ($CO_2$) laser source, or any other type of lasers source that can create two laser beams. For example, the laser source 102 may also include a neodymium-doped yttrium aluminum garnet (Nd:YAG) laser source. In one embodiment, the laser beam 122 may be emitted through an aperture 132 of a collector 104.

In one embodiment, the EUV light source 100 may include a tin droplet generator 110. The tin droplet generator 110 may generate tin droplets 126 that fall down through the EUV light source 100 in front of the laser source 102. A droplet catcher 106 may be located on a side of the EUV light source 100 that is opposite the tin droplet generator 110. The droplet catcher 106 may catch the tin droplets 126 that are not struck by the laser beam 122.

Although the FIG. 2 illustrates a tin droplet generator 110, other types of materials may also be used. For example, the droplets may be a tin containing liquid material such as a eutectic alloy containing tin, lithium, and xenon.

In one embodiment, the tin droplets 126 may be generated to have a diameter of approximately 30 microns. The tin droplet generator 110 may generate the tin droplets 126 at a rate of approximately 50 kilohertz. The tin droplet generator 110 may drop the tin droplets 126 at a rate of approximately 70 meters per second.

In one embodiment, the laser beam 122 may strike the tin droplets 126 to form a plasma. As noted above, the laser beam 122 may include two laser beams that are pulsed. A first laser beam (or an adopted pre-pulse laser) may hit the tin droplet 126 to shape the tin droplet 126. For example, the tin droplet 126 may be flatten to a "pancake" like shape, which may be referred to as a precursor target.

A second laser beam (or a main-pulse laser) may be used to almost instantaneously vaporize and ionize the tin droplet 126 into a plasma. The second laser beam may be emitted at a higher power than the first laser beam. The second laser beam may be emitted for an appropriate duration and at a certain angle to hit the tin droplets 126 that are shaped to generate the plasma. The plasma may emit an EUV light in a spectrum having a wavelength of approximately 4-20 nm. In one embodiment, the EUV light emitted by the plasma may be approximately 13.5 nm.

In one embodiment, the activation of the laser beam 122 and the generation of the tin droplets 126 by the tin droplet generator 110 may be synchronized or controlled. The tin droplet generator 110 may be controlled such that the tin droplets 126 consistently receive peak powers from the laser source 102.

In one embodiment, the collector 104 may be configured to collect, reflect, and focus the EUV light towards a scanner 118. The collector 104 may have a reflective or mirrored side having an ellipsoidal geometry. For example, the collector 104 may be fabricated from a reflective material or coated with a reflective or mirrored material. For example, the coating material may be a number of molybdenum and silicon film pairs with a capping layer such as ruthenium.

In some embodiments, the collector 104 may include a grating structure to scatter the laser beam 122. For example, a silicon nitride layer may be coated onto the collector 104 and patterned to have a grating structure.

In one embodiment, the aperture 132 may be located at an approximate center of the collector 104. In one embodiment, the aperture 132 may be located off center of the collector 104. Regardless of where the aperture 132 is located, the aperture 132 may be located such that the laser beam 122 may be emitted through the aperture 132 to hit the tin droplets 126 to generate the plasma.

In one embodiment, the EUV light source 100 may include a gas distributor 120. The gas distributor 120 may distribute a cleaning gas into the EUV light source 100. The gas distributor 120 may be positioned around a circumference of the collector 104. The gas distributor 120 may include other components that are not shown, such as, a regulator to control the flow of the cleaning gas out of the gas distributor 120.

In one embodiment, the cleaning gas may be hydrogen gas. A heater (e.g., a radio frequency energy source that I not shown) may heat the hydrogen gas before exiting the gas distributor 120. The hydrogen gas may be heated to a predefined temperature that converts the hydrogen gas into free radicals. In other words, the predefined temperature may be a temperature that can break a bond in the hydrogen gas, or any other cleaning gas, to create free radicals. The free radicals may help remove contamination from the laser source 102 and/or the laser beam 122.

In one embodiment, the EUV light source 100 may also include a plurality of vanes 112. The vanes 112 are arranged around an optical axis of the collector 104 (e.g., the optical axis may be represented by a line drawn from the aperture 132 to the scanner 118). The vanes 112 may be thin and elongated plates that are aligned so that their longitudinal axes are parallel to the optical axis. The vanes 112 may be fabricated such as stainless steel, coper, aluminum, ceramics, and the like.

The surface of the vanes 112 may be coated with a catalytic layer including ruthenium, tin, tin oxide, titanium oxide, or any combination thereof. The vanes 112 may collect any tin debris created from the plasma that is generated and prevent the tin debris from falling directly on the surface of the collector 104. For example, the surface of the vanes 112 may be coated with ruthenium that may reduce $SnH_4$ (generated by the tin and hydrogen cleaning gas) to tin and trap the tin thereon.

In one embodiment, the vanes 112 may also have a temperature control to cycle between a warm and hot cycle. For example, the temperature of the vanes 112 may be controlled to be from about 100 degrees Celsius (° C.) to 350° C. In one embodiment, the hot cycle may melt the tin debris at a temperature that avoids bubbling of the tin. For example, the hot cycle may be at a temperature between approximately 232° C. to 350° C.

The warm cycle may be a temperature that maintains the tin debris in liquid form and allows the melted tin debris to slide and roll smoothly along the vanes 112 towards a gutter 114. In one embodiment, the warm cycle may be at a temperature between approximately 100° C. to 232° C.

In one embodiment, the tin debris may fall as liquid and flow into the gutter 114 and through a drip pin 116 towards a bucket 108. In one embodiment, although the EUV light source 100 is illustrated as being horizontal, the EUV light source 100 may be angled or tilted to allow the tin debris to slide down the vanes 112 into the gutter 114 via gravity.

In addition, it should be noted that the EUV light source 100 has been simplified for ease of explanation. The EUV light source 100 of the present disclosure may include additional components that are not illustrated. For example, the EUV light source 100 may include a radio frequency (RF) generator to heat the cleaning gas, an exhaust module to collect any additional waste gas or debris, a controller to control operation of the various components and the like.

Figure 3:
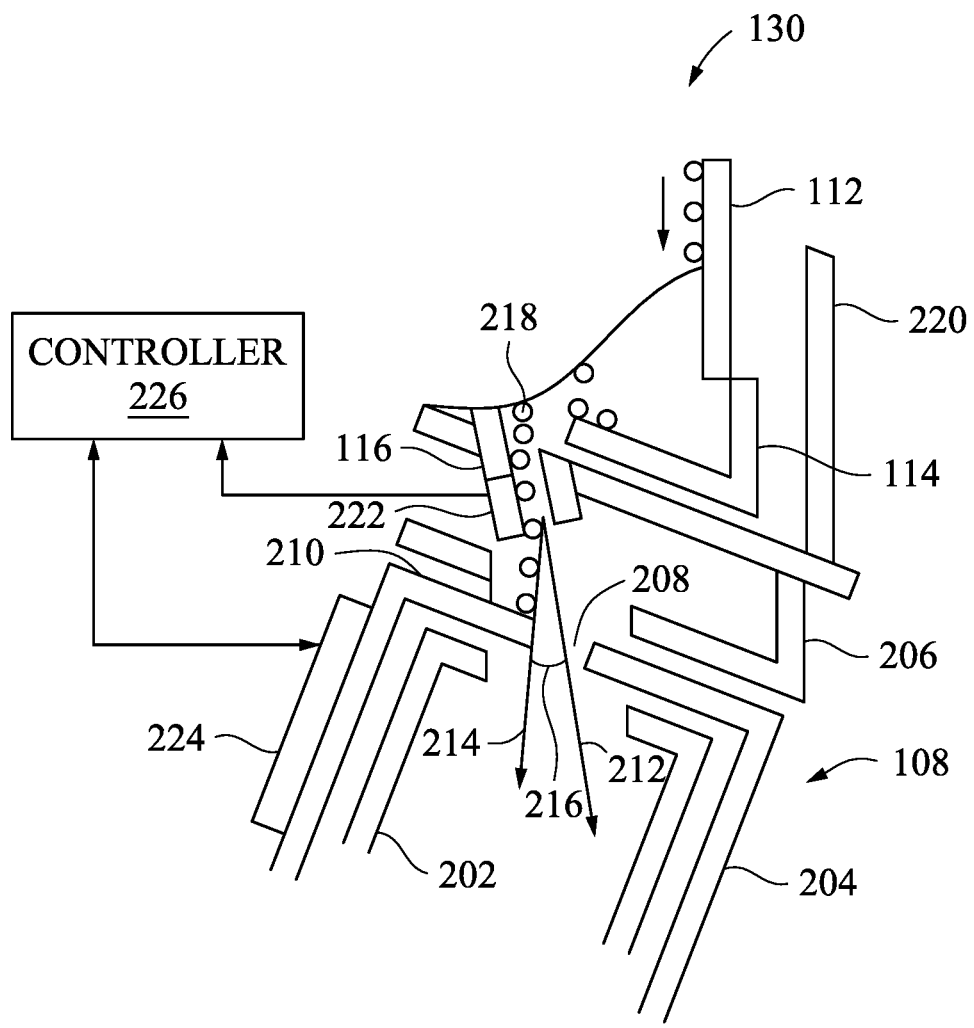
FIG. 3 illustrates a more detailed cross-sectional view of a portion of the EUV light source that includes the heated tin vane bucket with a heated cover according to at least one embodiment of the present disclosure.

FIG. 3 illustrates a more detailed cross-sectional view of a portion 130 of the EUV light source 100. In one embodiment, the bucket 108 may include a volume or heated tin vane bucket 202 and a cover 204. The cover 204 may include at least one opening 208.

As described above, tin debris 218 may slide or roll down the vanes 112 that are located inside of a shell or vessel wall 220 of the EUV light source 100. The tin debris 218 may roll down as a liquid or liquid droplets into the gutter 114. The gutter 114 may then guide the tin debris 218 towards the drip pin 116.

In one embodiment, the tin debris 218 may fall directly through the opening 208 of the cover into the heated tin vane bucket 202 as shown by an arrow 212. However, as the tin debris 218 reaches the end of the drip pin 116, the tin debris 218 may form a droplet. Due to the tin wettability of the pin, the tin debris 218 may take a concave shape. The surface tension pulls on the tin droplet causing the droplets of tin debris 218 to fall at an angle 216 relative to the line 212, as shown by a line 214.

However, when the tin debris 218 contacts a cooler surface (e.g., a surface of a heat shield 206, or a surface 210 around the opening 208 of the cover 204, the tin debris 218 that drops as a liquid may solidify. Over time, the solid tin debris may form a stalagmite and clog the drip pin 116 causing the tin debris 218 to overflow out of the gutter 114 towards the collector 104. As noted above, the overflowing tin debris 218 may react with the hydrogen radicals and cause tin spitting on the heat shield, which is located adjacent to the collector 104. The tin spitting may then contaminate the collector 104.

In one embodiment, the cover 204 may include a heater 224. The heater 224 may heat the cover to melt any tin debris 218 that has solidified. In one embodiment, a sensor 222 may be located in or near the drip pin 116. The sensor 222 may detect the presence of tin debris 218 that has solidified or the formation of a tin stalagmite. In one example, the sensor 222 may be a resistive sensor, a contact sensor, and the like.

In one embodiment, a controller 226 may be in communication with the sensor 222 and the heater 224. In one embodiment, the sensor 222 may send an indication or a signal to the controller 226 when solid tin debris is detected. In response, the controller 226 may activate the heater 224 to heat the cover 204 and melt the solid tin debris. In one embodiment, the controller 226 may activate the heater 224 when a plasma generation process is deactivated or inactive (e.g., between EUV light generation).

In one embodiment, the controller 226 may receive an indication based on a manual observation. For example, a technician may observe tin spitting on the heat shield and provide an input on a user interface (not shown) of the EUV light source 100. In response, the controller 226 may activate the heater 224 to heat the cover 204 and melt the solid tin debris.

Figure 4:
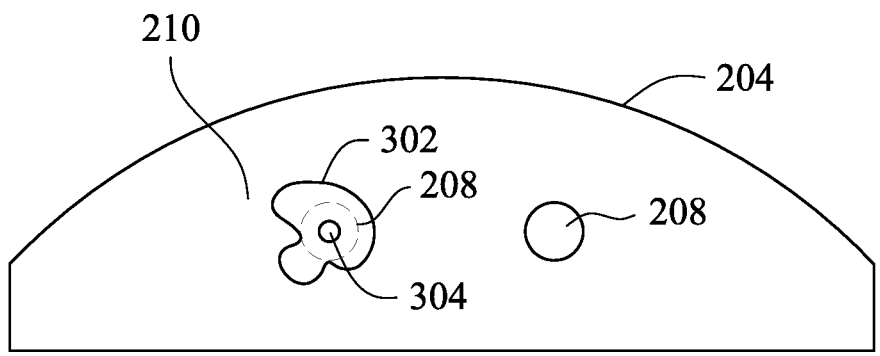
FIG. 4 illustrates a top view of the heated cover according to at least one embodiment of the present disclosure.

FIG. 4 illustrates a top view of the cover 204. The cover 204 may include at least one opening 208. In some embodiments, the cover 204 may include two openings 208. FIG. 3 illustrates how the tin debris 218 has solidified into solid tin debris 302 on the surface 210 around the opening 208 of the cover 204. The solid tin debris 302 begins to block the opening 208 (e.g., the actual size of the opening 208 is illustrated in dashed lines below the solid tin debris 302). The heater 224 may heat the cover 204 to melt the solid tin debris 302 and allow the tin debris to fall through the opening 208 and into the heated tin vane bucket 204.

Figure 5:
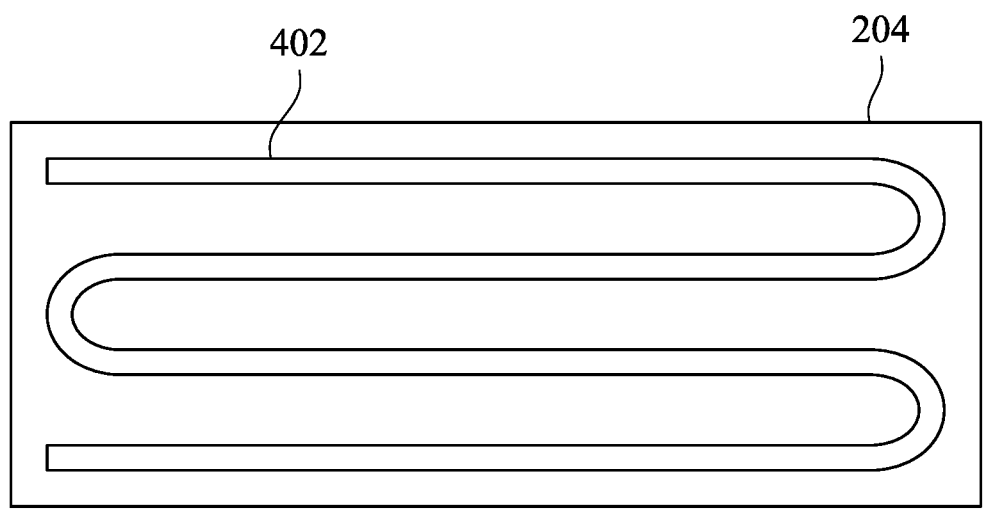
FIG. 5 illustrates a side view of the heated cover according to at least one embodiment of the present disclosure.

FIG. 5 illustrates a side view of the cover 204. In one embodiment, the heater 224 may be deployed as a heating coil 402. The heating coil 402 may be an inductive heat source that is coupled to a side of the cover 204. In one embodiment, the heating coil 402 may cover at least 50% of the surface area of a side of the cover 204. The heating coil 402 may generate enough heat to heat the cover 204 to a temperature that is above the melting point of the solid tin debris 302. It should be noted that the heating coil 402 is one example of the heater 224. The heater 224 may also be deployed as a radiant heat source, heat generated from an external heat source and directed towards the surface of the cover 204, and the like.

Figure 6A:
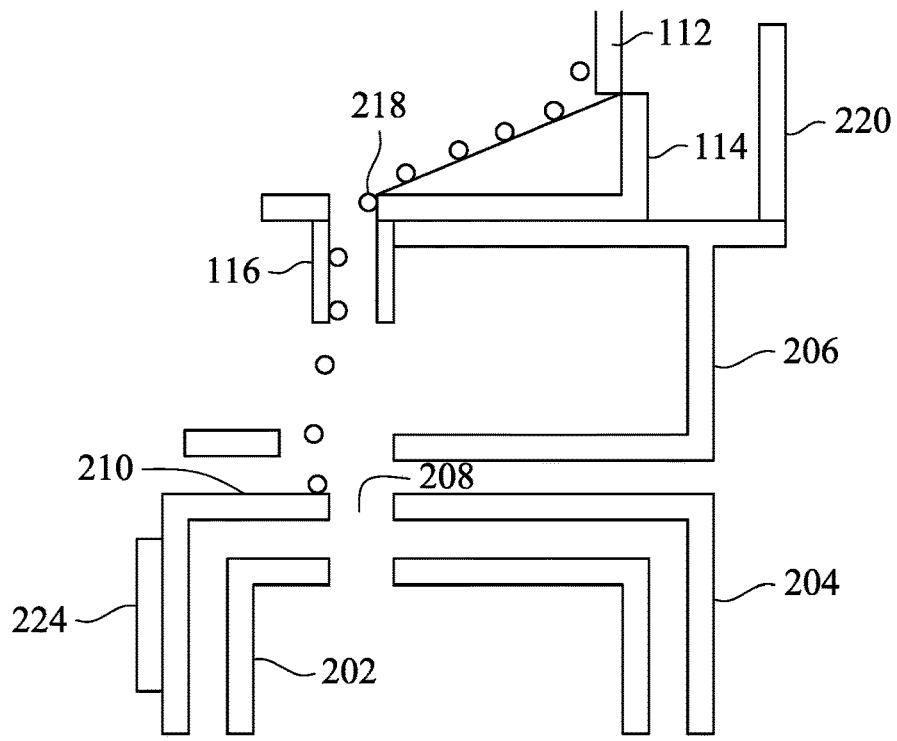
FIGS. 6A-6D illustrates partial cross-sectional views of the heated cover of the heated tin vane bucket in operation.

FIGS. 6A-6D illustrate a plurality of partial cross-sectional views illustrating one embodiment of the heated cover of the heated tin vane bucket in operation in accordance with at least one embodiment of the present disclosure. Referring to FIG. 6A, tin debris 218 that is generated during plasma generation may be collected by the plurality of vanes 112. For example, after tin droplets are struck by a laser beam the tin may be ionized into plasma and emit a EUV light that is collected and redirected towards a scanner.

In one embodiment, tin debris 218 from the ionization of the tin droplets may be collected by the vanes 112. The vanes 112 may be heated to allow the tin debris 218 to roll or slide down the vanes 112 towards the gutter 114. As noted above, when the tin debris 218 reaches an end of the dip pin 116, the tin debris 218 may form a droplet that has a concave shape. The surface tension of the droplet and the concave shape may cause the droplets to fall at an angle away from an opening 208 of the cover 204. When the droplets contact a cool surface (e.g., the heat shield 206 or a surface 210 around the opening 208 of the cover 204), the droplets may solidify.

Figure 6B:
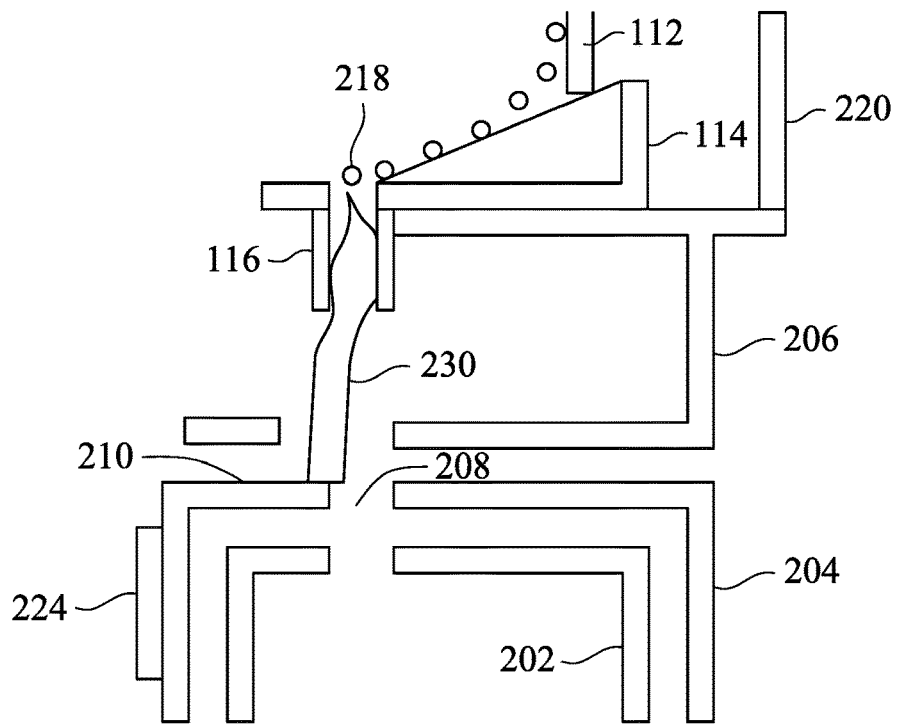

In FIG. 6B, over time the droplets of tin debris 218 may solidify to form a stalagmite 230 of tin. The stalagmite 230 may grow and eventually plug or clog the opening of the drip pin 116.

Figure 6C:
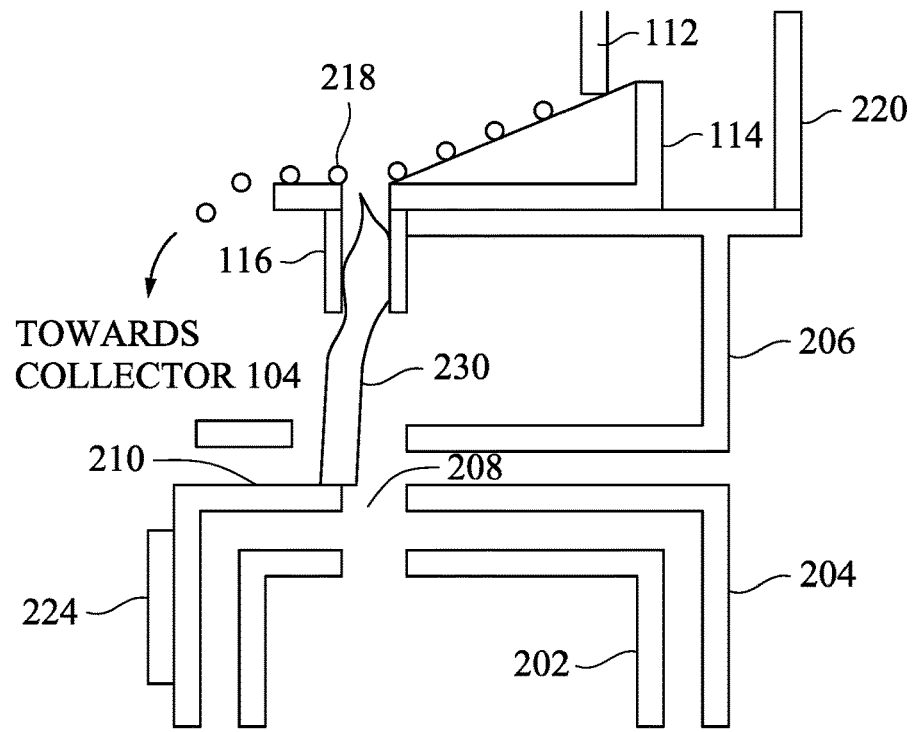

In FIG. 6C, subsequent tin debris 218 that slides off of the vanes 112 may be unable to fall through the drip pin 116. As a result, the tin debris 218 may begin to over flow out of the gutter 114 towards the heat shield 206, which may extend inwards (e.g., away from the vessel wall 220) towards the out circumference of a collector (shown in FIG. 1).

As noted above, cleaning gas such as hydrogen may be fed into the EUV light source. The hydrogen gas may be heated (e.g., via an RF energy source) to generate hydrogen radicals. The hydrogen radicals may enter the droplets of tin debris 218 that overflow out of the gutter 114. The hydrogen radicals may form a bubble inside of the droplets of tin debris 218. As the pressure builds the bubble may burst causing tin spitting on portions of the heat shield 206 that are near the collector. Tin that collects on the heat shield 206 near the collector may then fall onto the collector and cause contamination of the collector. When the collector is contaminated, the EUV light emitted by the ionized tin droplets may not be properly collected and reflected.

Figure 6D:
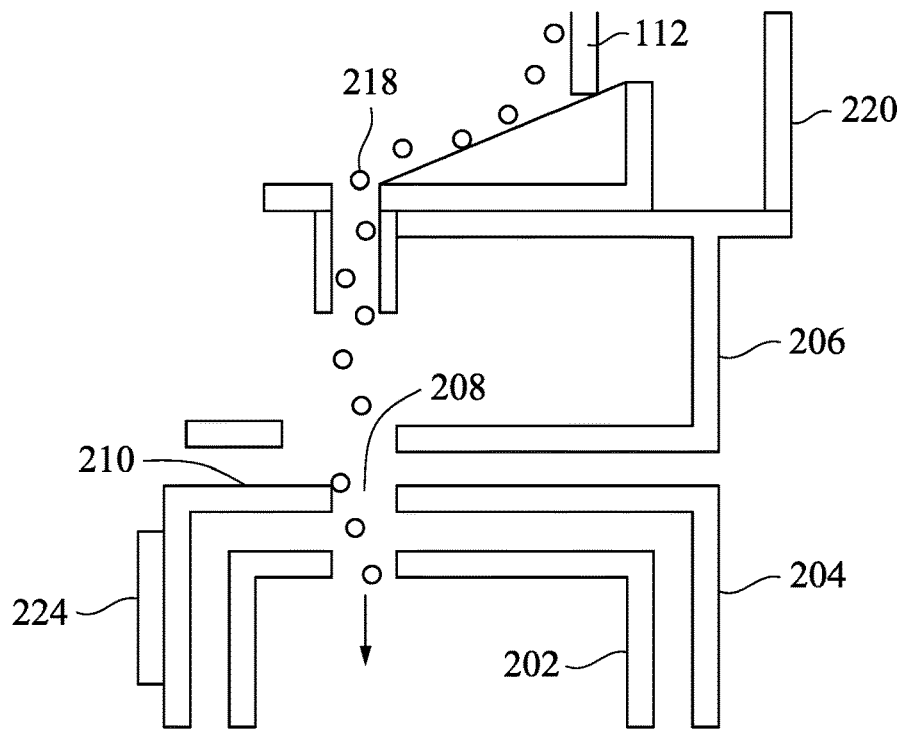

In FIG. 6D, a heater 224 may be activated in response to the detection of the drip pin 116 being clogged by the stalagmite 230. In one embodiment, a sensor may be located in, on, or near the drip pin 116 to detect the solid tin formed in the stalagmite 230. The sensor may then send an indication to a controller. In response, the controller may activate the heater 224. The heater 224 may heat the cover 204 to a temperature at or above a melting temperature of the tin.

In one embodiment, the heater 224 may be activated by a technician based on a manual observation. For example, the technician may see the tin spitting on the heat shield 206 near the collector, which may be an indication that the drip pin 116 is clogged by the stalagmite 230. In response, the technician may provide an indication to a controller via user interface or activate the heater 224 via the user interface.

When the cover 204 is heated to a temperate at or above the melting point of tin, the stalagmite 230 of tin may be melted. The liquid tin debris 218 may fall through the opening 208 of the cover 204 and into the heated tin vane bucket 202.

In one embodiment, the heater 224 may be activated when the plasma generation process is deactivated. For example, the heater 224 may be activated between processing of wafers via the EUV light source. Said another way, the heater 224 may be activated when the laser source and the tin droplet generator are inactive.

Figure 7:
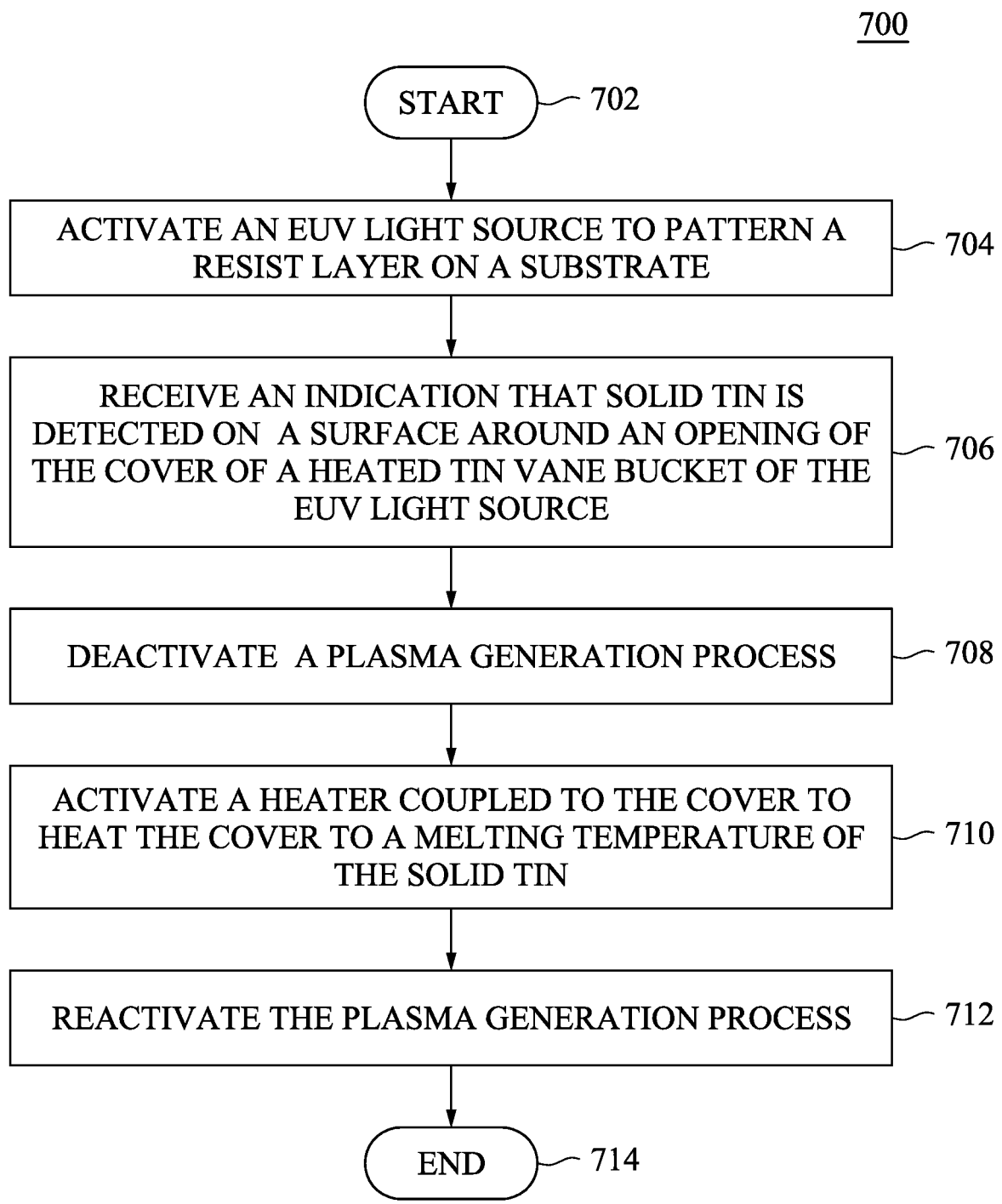
FIG. 7 illustrates a flowchart of a method of heating a cover of a heated tin vane bucket according to at least one embodiment of the present disclosure.

FIG. 7 illustrates a flowchart of a method 700 of heating a cover of a heated tin vane bucket according to at least one embodiment of the present disclosure. The method 700 may be performed via the controller 226 or another controller of the EUV light source 100.

While the method 700 is illustrated and described below as a series of acts or events, it will be appreciated that the illustrated ordering of such acts or events are not to be interpreted in a limiting sense. For example, some acts may occur in different orders and/or concurrently with other acts or events apparat from those illustrated and/or described herein. In addition, not all illustrated acts may be required to implement one or more aspects or embodiments of the description herein. Further, one or more of the acts depicted herein may be carried out in one or more separate acts and/or phases.

The method 700 begins at block 702. At block 704, the method 700 activates an EUV light source to pattern a resist layer on a substrate. For example, the EUV light source may be part of a lithography system illustrated in FIG. 1, and discussed above.

At block 706, the method 700 receives an indication that solid tin is detected on a surface around an opening of a cover of a heated tin vane bucket. For example, a sensor in, on, or near a drip pin may detect solid tin that may be clogging the opening of the drip pin. In response, the sensor may send an indication or an electronic signal to a controller.

In one embodiment, the indication may be a signal from a user interface provided by a technician. For example, the technician may manual observe tin spitting on a heat shield near a collector of the EUV light source. The tin spitting may indicate that the drip pin is clogged by a solid stalagmite of tin.

At block 708, the method 700 deactivates a plasma generation process. In one embodiment, the method 700 may wait until a current plasma generation process is completed and temporarily deactivate the plasma generation process. In another embodiment, the method 700 may immediately pause the plasma generation process to prevent any further miss-processing of a wafer that may be caused by potential contamination of the collector.

At block 710 the method 700 activates a heater coupled to the cover to heat the cover to a melting temperature of the solid tin. In one embodiment, the heater may be a heating coil coupled to a surface of the cover. The heating coil may generate inductive heat that heats the cover to a temperature above a melting point of tin. The cover may be heated to melt the solid stalagmite of tin. The tin may melt and then flow through the opening of the cover and into the heated tin vane bucket.

In one embodiment, any type of heater or energy source may be applied to heat the cover. For example, a radiant heater, an RF energy source, an external heater that directs heat onto the surface of the cover, or any combination thereof may be used.

At block 712, the method 700 reactivates the plasma generation process. After the thermal cycle of the heater on the cover is executed, the plasma generation process may be reactivated. In one embodiment, where a sensor is deployed in, on, or near the drip pin, the controller may wait until a second indication is received from the sensor. The second indication may indicate that the solid stalagmite of tin is no longer detected in the drip pin. In response, the controller may deactivate the heater and reactivate the plasma generation process. In one embodiment, the blocks 706-712 may be continuously repeated during operation of the EUV light source. At block 714, the method 700 ends.

Therefore, the present disclosure relates to an EUV light source that includes a heated tin vane bucket with a heated cover. The heated cover may include an opening where liquid tin that solidifies into solid tin may form on a surface around the opening. The heated cover may include a heater that heats the cover to melt the solid tin.

In other embodiments, the present disclosure relates to an EUV light source that is part of a lithography system. The EUV light source may include a tin droplet generator to generate a plurality of liquid tin droplets. A laser source may direct a laser through an aperture of a collector to contact one of the plurality of liquid tin droplets to generate a plasma. The plasma may radiate at EUV wavelengths that are reflected by the collector towards a scanner. The EUV light source may include a plurality of tin vanes that redirect tin debris formed from the plasma that is generated. A heated tin vane bucket may collect the tin debris. The heated tin vane bucket may include a heater and a cover that includes an opening to allow the tin debris to fall into the heated tin vane bucket. The heater may heat the cover to melt any solid tin that may form on a surface around the opening of the cover.

In yet other embodiments, the present disclosure relates to a method for patterning a resist layer on a substrate using an EUV light source. The method includes activating the EUV light source to pattern the resist layer on the substrate. During operation of the EUV light source, solid tin is detected on a surface around an opening of a cover of a heated tin vane bucket of the EUV light source. The solid tin may be detected based on stalagmites that grow from the surface up into a drip pin that contains a sensor. The solid tin may also be detected based on visual observation of a collector that shows tin spitting has occurred. A plasma generation process may be deactivated and a heater coupled to the cover may be activated to heat the cover and melt the solid tin that is detected. The plasma generation process may be reactivated after the solid tin is melted.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) light source, comprising:
   a droplet generator to generate tin droplets;
   a droplet catcher opposite to the droplet generator to catch the tin droplets;
   a laser source to generate a laser beam striking the tin droplets to form a plasma;
   a plurality of vanes arranged around an axis to collect tin debris created from the plasma; and
   a bucket connected to the vanes and comprising:
   a cover having an opening;
   a vane bucket surrounded by the cover; and
   a heater on an outer sidewall of the cover external to the cover and spaced apart from the droplet catcher.

2. The EUV light source of claim 1, wherein the bucket is spaced apart from the droplet catcher.

3. The EUV light source of claim 1, wherein the bucket is between the droplet catcher and the vanes.

4. The EUV light source of claim 1, further comprising a gutter adjacent to an end of the plurality of vanes to collect the tin debris.

5. The EUV light source of claim 4, further comprising a drip pin extending from the gutter toward the bucket.

6. The EUV light source of claim 5, further comprising a sensor connecting to the drip pin.

7. The EUV light source of claim 1, wherein the opening of the cover of the bucket faces the vanes.

8. An extreme ultraviolet (EUV) light source, comprising:
   a collector comprising an aperture;
   a laser source to direct a laser beam through the aperture of the collector to contact one of a plurality of liquid tin droplets to generate a plasma that radiates at EUV wavelengths that are reflected by the collector towards a scanner;
   a plurality of vanes arranged around an optical axis of the collector to collect tin debris created from the plasma;
   a gutter to collect the tin debris flowing from the vanes; and
   a bucket connected to the vanes and comprising:
      a vane bucket collecting the tin debris flowing from the gutter;
      a cover covering the vane bucket and having an opening; and
      a heater directly on an outer sidewall of the cover, wherein the outer sidewall of the cover is directly between the heater and the vane bucket.

9. The EUV light source of claim 8, further comprising a heat shield between the gutter and the bucket, wherein the heat shield causes the tin debris to solidify.

10. The EUV light source of claim 9, wherein the heat shield is spaced apart from the bucket.

11. The EUV light source of claim 9, further comprising a drip pin extending from the gutter toward the heat shield.

12. The EUV light source of claim 11, further comprising a sensor connected to the drip pin to detect solid tin in the drip pin.

13. The EUV light source of claim 8, wherein the heater comprises a heating coil coupled to the cover.

14. The EUV light source of claim 13, wherein the heating coil contacts at least 50% of the outer sidewall of the cover.

15. A method for patterning a resist layer on a substrate using an extreme ultraviolet (EUV) light source, comprising:
   providing a laser beam to a plurality of tin droplets to generate a plasma that emits an EUV light to the resist layer, wherein tin debris created from the plasma are collected by a plurality of vanes in the EUV light source;
   detecting, by a sensor, solid tin at a path of the tin debris flowing from the vanes to a vane bucket; and
   heating a cover covering the vane bucket, by a heater external to the cover, to melt the solid tin after detecting the solid tin.

16. The method of claim 15, further comprising stopping providing the laser beam to the plurality of tin droplets prior to heating the cover.

17. The method of claim 16, further comprising receiving an indication from the sensor that the solid tin is not detected at the path of the tin debris flowing from the vanes to the vane bucket.

18. The method of claim 17, further comprising providing the laser beam to the plurality of tin droplets again after receiving the indication from the sensor.

19. The method of claim 15, wherein the sensor is a resistive sensor or a contact sensor.

20. The method of claim 15, wherein the heater comprises a heating coil that contacts a surface of the cover.

* * * * *